(12) United States Patent
Shimizu

(10) Patent No.: US 7,456,689 B2
(45) Date of Patent: Nov. 25, 2008

(54) AMPLIFIER CIRCUIT AND GAIN CONTROL METHOD THEREOF

(75) Inventor: Yutaka Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 11/689,116

(22) Filed: Mar. 21, 2007

(65) Prior Publication Data

US 2007/0236290 A1   Oct. 11, 2007

(30) Foreign Application Priority Data

Mar. 22, 2006   (JP) ............................. 2006-078522

(51) Int. Cl.
   *H03G 3/10*   (2006.01)
(52) U.S. Cl. ...................... 330/278; 330/311
(58) Field of Classification Search ................. 330/254, 330/278, 311
   See application file for complete search history.

(56) References Cited

U.S. PATENT DOCUMENTS 6,175,278 B1   1/2001   Hasegawa ................. 330/278
6,211,737 B1*  4/2001   Fong ......................... 330/282
6,710,657 B2*  3/2004   Yang ......................... 330/254
2007/0222515 A1* 9/2007  Koutani et al. ............. 330/254

FOREIGN PATENT DOCUMENTS

JP   9-321577   12/1997

OTHER PUBLICATIONS

Willy M.C. Sansen, et al., "Distortion in Bipolar Transistor Variable-Gain Amplifiers", IEEE Journal of Solid-State Circuits, vol. 8, Aug. 1973, pp. 275-282.

* cited by examiner

*Primary Examiner*—Khanh V Nguyen
(74) *Attorney, Agent, or Firm*—Oblon, Spivak, McClelland, Maier & Neustadt, P.C.

(57) ABSTRACT

An amplifier circuit is provided with a control section that respectively selectively supplies either a second voltage or a third voltage to gates of a plurality of second transistors and gates of a plurality of third transistors by respectively switching the connection states of a plurality of first switching elements and a plurality of second switching elements to their first input terminal sides or to their second input terminal sides.

20 Claims, 4 Drawing Sheets

AMPLIFIER CIRCUIT AND GAIN CONTROL METHOD THEREOF

CROSS REFERENCE TO RELATED APPLICATIONS

This application is based upon and claims the benefit of priority from the prior Japanese Patent Application No. 2006-78522, filed on Mar. 22, 2006, the entire contents of which are incorporated herein by reference.

BACKGROUND OF THE INVENTION

The present invention relates to an amplifier circuit and a gain control method thereof.

Radio communication devices such as mobile phones are provided with variable gain amplifiers that adaptively vary gain (output voltage/input voltage) according to control signals Such a variable gain amplifier generates an output voltage of a desired voltage level by amplifying an input voltage while controlling gain according to a supplied control signal.

A name of a reference document on variable gain amplifiers will be provided below Japanese Patent Laid-Open No. H9-321577

SUMMARY OF THE INVENTION

An amplifier circuit according to an aspect of the present invention is provided with:

a transistor group including a first transistor, a plurality of second transistors and a plurality of third transistors, wherein sources of the first transistor, the plurality of second transistors and the plurality of third transistors are commonly connected, drains of the first transistor and the plurality of second transistors are commonly connected, and drains of the plurality of third transistors are commonly connected;

a first voltage generating section connected to the gate of the first transistor, which generates a desired first voltage and supplies the first voltage to the gate of the first transistor;

a plurality of first switching elements respectively connected via respective output terminals thereof to the gates of the plurality of second transistors;

a plurality of second switching elements respectively connected via respective output terminals thereof to the gates of the plurality of third transistors;

a second voltage generating section connected to respective first input terminals of the plurality of first switching elements and the plurality of second switching elements, which generates a second voltage that is either the same as or different from the first voltage;

a third voltage generating section connected to respective second input terminals of the plurality of first switching elements and the plurality of second switching elements, which generates a third voltage having a voltage difference with respect to the source voltage of the commonly-connected first to third transistors that is smaller than that of the second voltage; and a control section that respectively selectively supplies either the second voltage or the third voltage to the gates of the plurality of second transistors and the gates of the plurality of third transistors by respectively switching the connection states of the plurality of first switching elements and the plurality of second switching elements to the sides of the first input terminals or to the sides of the second input terminals.

DETAILED DESCRIPTION OF THE INVENTION

An embodiment of the present invention will be described below with reference to the accompanying drawings.

Figure 1:
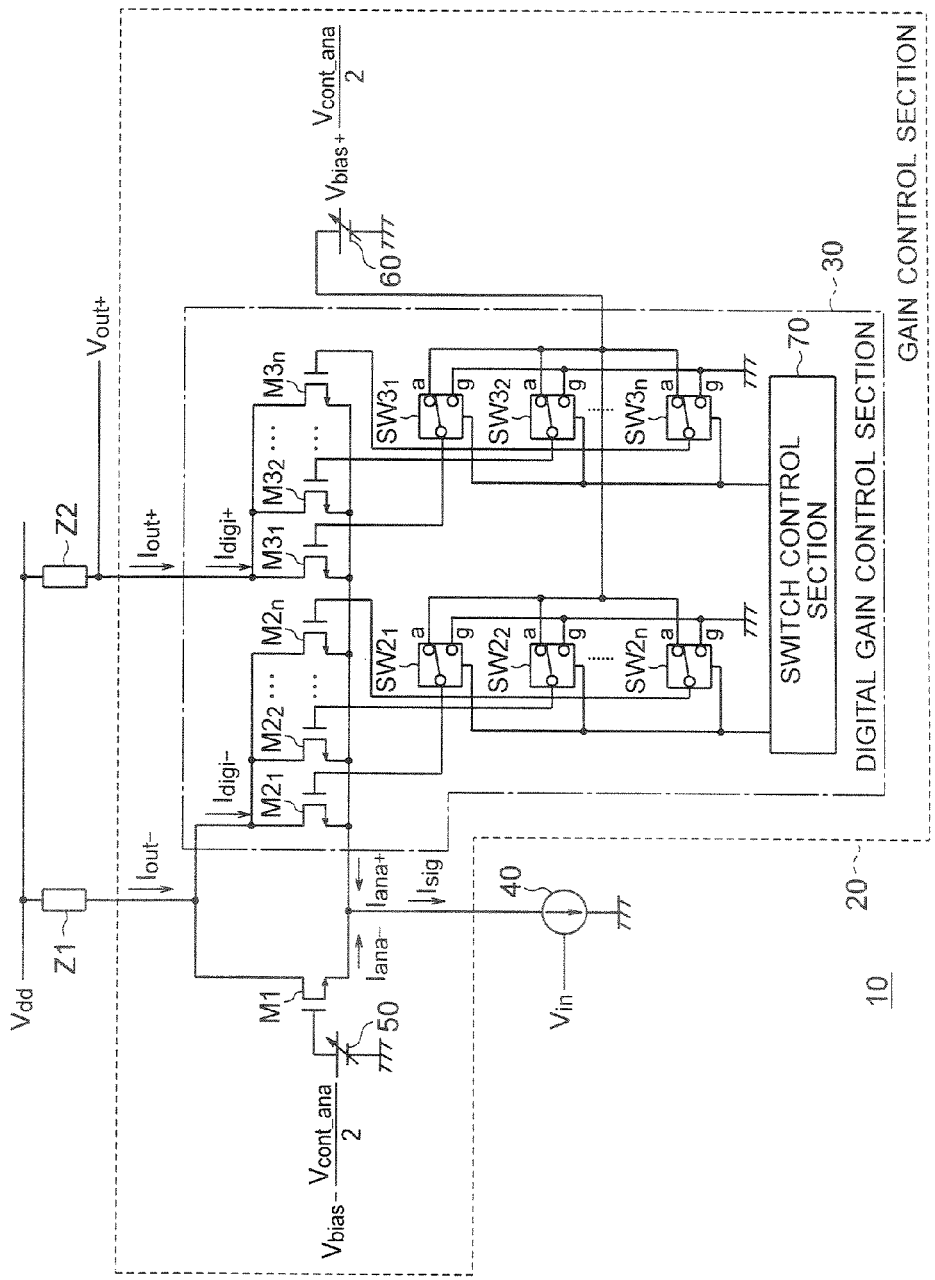
FIG. 1 is a circuit diagram showing a configuration of a variable gain amplifier according to an embodiment of the present invention.

FIG. 1 shows a configuration of a variable gain amplifier 10 according to an embodiment of the present invention. The variable gain amplifier 10 generates an output voltage $V_{out+}$ of a desired voltage level by amplifying an input voltage $V_{in}$ while adaptively varying gain.

The variable gain amplifier 10 is provided with a gain control section 20 for controlling gain. As methods for controlling gain, the gain control section 20 is provided with an analog gain control method that continuously varies gain according to a supplied control voltage $V_{cont\_ana}$, and a digital gain control method that discretely varies gain.

In the latter case, the digital gain control method is performed by a digital gain control section 30 provided at the gain control section 20.

As described above, the gain control section 20 either continuously or discretely varies gain through the selective use of either the analog gain control method or the digital gain control method as a gain control method.

A transconductance ($g_m$) amplifier (hereinafter referred to as "amplifier") 40, connected between the gain control section 20 and a ground GND, converts the input voltage $V_{in}$ to a current $I_{sig}$.

The gain control section 20 is provided with NMOS transistors (hereinafter referred to as "transistors") M1, $M2_1$ to $M2_n$ and $M3_1$ to $M3_n$ for dividing the current $I_{sig}$. Among the transistors M1, $M2_1$ to $M2_n$ and $M3_1$ to $M3_n$, transistors $M2_1$ to $M2_n$ and $M3_1$ to $M3_n$ are included in the digital gain control section 30.

Sources of the transistors M1, $M2_1$ to $M2_n$ and $M3_1$ to $M3_n$ are commonly connected and are also connected to one end of the amplifier 40. Drains of the transistors M1 and $M2_1$ to $M2_n$ are commonly connected and are also connected to one end of a load Z1. Drains of the transistors $M3_1$ to $M3_n$ are commonly connected and are also connected to one end of a load Z2. Other ends of the load Z1 and Z2 are connected to a supply voltage $V_{dd}$. Instead of providing the load Z1, the drains of the transistors M1 and $M2_1$ to $M2_n$ may be directly connected to the supply voltage $V_{dd}$.

A variable voltage supply 50, connected between the gate of the transistor M1 and the ground, generates an analog control voltage $V_{bias} - V_{cont\_ana}/2$ by varying the control voltage $V_{cont\_ana}$, and applies the analog control voltage to the gate of the transistor M1.

The gates of the transistors $M2_1$ to $M2_n$ are respectively connected to output terminals of corresponding switches $SW2_1$ to $SW2_n$. Similarly, the gates of the transistors $M3_1$ to $M3_n$ are respectively connected to output terminals of corresponding switches $SW3_1$ to $SW3_n$. The switches $SW2_1$ to $SW2_n$ and $SW3_1$ to $SW3_n$ are included in the digital gain control section 30.

A variable voltage supply 60, connected between the first input terminals "a" of the switches $SW2_1$ to $SW2_n$ and $SW3_1$ to $SW3_n$ and the ground GND, generates an analog control voltage $V_{bias} + V_{cont\_ana}/2$ by varying the control voltage $V_{cont\_ana}$. Meanwhile, second input terminals "g" of the switches $SW2_1$ to $SW2_n$ and $SW3_1$ to $SW3_n$ are connected to the ground GND.

Connection states of the switches $SW2_1$ to $SW2_n$ and $SW3_1$ to $SW3_n$ are switched based on control by a switch control section 70 provided at the digital gain control section 30.

More specifically, when the connection states of the switches $SW2_1$ to $SW2_n$ and $SW3_1$ to $SW3_n$ are switched to the first input terminal "a" sides, the analog control voltage $V_{bias} + V_{cont\_ana}/2$ will be applied to the gates of the transistors $M2_1$ to $M2_n$ and $M3_1$ to $M3_n$. When the connection states of the switches $SW2_1$ to $SW2_n$ and $SW3_1$ to $SW3_n$ are switched to the second input terminal "g" sides, a voltage sufficiently low in comparison to the analog control voltage $V_{bias} + V_{cont\_ana}/2$ (in other words, a voltage having a voltage difference with respect to the source voltage of the commonly-connected transistors M1, $M2_1$ to $M2_n$ and $M3_1$ to $M3_n$ which is smaller than that of the analog control voltage $V_{bias} + V_{cont\_ana}/2$), such as a voltage of 0V, is applied to the gates of the transistors $M2_1$ to $M2_n$ and $M3_1$ to $M3_n$.

Among the transistors $M2_1$ to $M2_n$ and $M3_1$ to $M3_n$, the transistors "M" having gates to which the analog control voltage $V_{bias} + V_{cont\_ana}/2$ has been applied assume on-states, and as a result, a current flows through such transistors "M". In contrast, the transistors "M" having gates to which 0V has been applied assume off-states, and as a result, a current will not flow through such transistors "M".

Now, assume that the gate width (channel width) "W" of the transistor M1 is $W_{M1}$. In addition, assume that a sum of the gate widths of the transistors "M" among the transistors $M2_1$ to $M2_n$, having gates to which the analog control voltage $V_{bias} + V_{cont\_ana}/2$ has been applied as a result of the connection states of the switches $SW2_1$ to $SW2_n$ being switched to the first input terminal "a" sides, is $W_{M2,a}$. Similarly, assume that a sum of the gate widths of the transistors "M" among the transistors $M3_1$ to $M3_n$, having gates to which the analog control voltage $V_{bias} + V_{cont\_ana}/2$ has been applied as a result of the connection states of the switches $SW3_1$ to $SW3_n$ being switched to the first input terminal "a" sides, is $W_{M3,a}$. Note that the transistors M1, $M2_1$ to $M2_n$ and $M3_1$ to $M3_n$ all share the same gate length (channel length) "L".

In this case, the switch control section 70 switches the connection states of the $SW2_1$ to $SW2_n$ and $SW3_1$ to $SW3_n$ while satisfying conditions expressed by the following formula:

$$W_{M1} \approx W_{M2,a} + W_{M3,a} \quad \text{[Formula 1]}$$

More specifically, the switch control section 70 switches the connection states of the $SW2_1$ to $SW2_n$ and $SW3_1$ to $SW3_n$ so that a sum of the gate widths $W_{M2,a} + W_{M3,a}$ of the transistors "M" having gates to which the analog control voltage $V_{bias} + V_{cont\_ana}/2$ has been applied, among the transistors $M2_1$ to $M2_n$ and $M3_1$ to $M3_n$, is substantially equal to the gate width $W_{M1}$ of the transistor M1.

In this manner, the current $I_{sig}$ obtained from the input voltage $V_{in}$ is first divided into a current $I_{ana-}$ and a current $I_{ana+}$ according to the control voltage $V_{cont\_ana}$. A current gain $G_{cont\_ana}$ at a circuit portion that performs this analog gain control method may be expressed as $$G_{cont\_ana} = \frac{I_{ana+}}{I_{sig}} = \frac{1}{2} + \frac{1}{I_{tail}} \frac{k'}{4} \frac{W_{M1}}{L} V_{cont\_ana} \sqrt{\frac{4 I_{tail}}{k'(W_{M1}/L)} - V_{cont\_ana}^2} \quad \text{[Formula 2]}$$

where "k'" is a constant, such as channel mobility or gate insulator capacitance, that is attributable to a device, and $I_{tail}$ is a direct bias current in the event that the input voltage $V_{in}$ has not been inputted.

In other words, the gain control section 20 controls the current gain $G_{cont\_ana}$ by varying the control voltage $V_{cont\_ana}$ and varying a dividing ratio that divides the current $I_{sig}$ into currents $I_{ana-}$ and $I_{ana+}$.

Among the divided currents $I_{ana-}$ and $I_{ana+}$, the current $I_{ana+}$ is further divided in the digital gain control section 30 into currents $I_{digi-}$ and $I_{digi+}$. A current gain $G_{cont\_digi}$ at the digital gain control section 30 may be expressed as $$G_{cont\_digi} = \frac{I_{digi+}}{I_{ana+}} = \frac{W_{M3,a}}{W_{M2,a} + W_{M3,a}} \quad \text{[Formula 3]}$$

As seen, since the current gain $G_{cont\_digi}$ at the digital gain control section 30 is determined by the ratio of gate widths "W", effects of production tolerance may be suppressed during control of the current gain $G_{cont\_digi}$, and gain may be varied more accurately in comparison with the analog gain control method.

Therefore, the current gain $G_{cont}$ at the gain control section 20 may be expressed as $$G_{cont} = \frac{I_{digi+}}{I_{sig}} = G_{cont\_ana} G_{cont\_digi} \quad \text{[Formula 4]}$$

Among the currents $I_{digi-}$ and $I_{digi+}$, the current $I_{digi-}$ is converted as a current $I_{out-}$ by the load Z1 into voltage, while the current $I_{digi+}$ is converted as a current $I_{out+}$ by the load Z2 into voltage. The variable gain amplifier 10 outwardly outputs the voltage generated through conversion of the current $I_{out+}$ by the load Z2 at the connection points of one end of the load Z1 and the drains of the transistors $M3_1$ to $M3_n$ as an output voltage $V_{out+}$.

Figure 2:
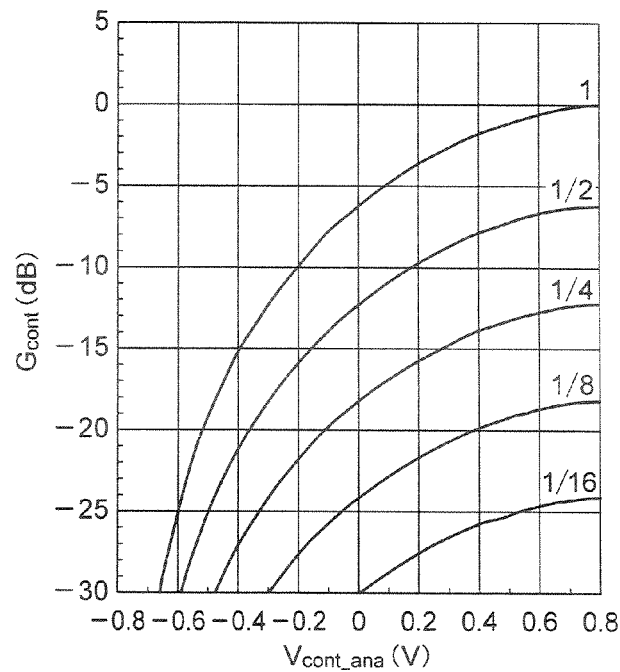
FIG. 2 is an explanatory diagram showing examples of relationships between a control voltage $V_{cont\_ana}$, and a current gain $G_{cont}$ at a gain control section provided at the variable gain amplifier.
Figure 3:
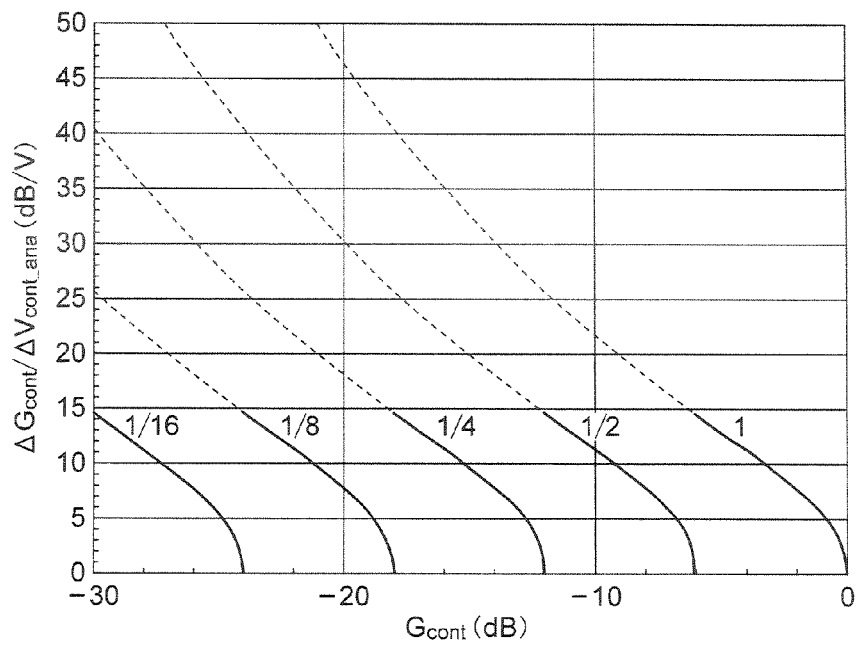
FIG. 3 is an explanatory diagram showing examples of relationships between the current gain $G_{cont}$ at the gain control section provided at the variable gain amplifier, and a gain conversion sensitivity $G_{cont}/V_{cont\_ana}$.

Examples of relationships between the control voltage $V_{cont\_ana}$ and the current gain $G_{cont}$ at the gain control section 20 are shown in FIG. 2. The relationships shown in FIG. 2 may be formed by selecting any one of the values of 1/16, 1/8, 1/4, 1/2 as the value of the current gain $G_{cont\_digi}$ at the digital gain control section 30 while satisfying the conditions expressed by Formula 1 provided above.

As shown in FIG. 2, when the analog gain control method is selected as the gain control method, the current gain $G_{cont}$ will be continuously varied in a transverse direction in the diagram by varying the control voltage $V_{cont\_ana}$. On the other hand, when the digital gain control method is selected as the gain control method, the current gain $G_{cont}$ will be discretely varied in a longitudinal direction in the diagram by varying the current gain $G_{cont\_digi}$ (in other words, the ratio between the sum $W_{M2,a}$ of the gate widths of the transistors $M2_1$ to $M2_n$ that have been changed to on-states and the sum $W_{M3,a}$ of the gate widths of the transistors $M3_1$ to $M3_n$ that have been changed to on-states).

Therefore, for instance, when attempting to significantly lower the current gain $G_{cont}$, the current gain $G_{cont}$ is first accurately varied by varying the above-mentioned gate width ratio using the digital gain control method that is less affected by production tolerance as compared to the analog gain control method. Then, using the analog gain control method, fine adjustment of the current gain $G_{cont}$ is performed by varying the control voltage $V_{cont\_ana}$. As a result, the current gain $G_{cont}$ may be varied accurately over a wide range.

As seen, by combining and selectively using the analog gain control method and the digital gain control method, for instance, the gain conversion sensitivity $G_{cont}/V_{cont\_ana}$ may be reduced for the current gain $G_{cont}$ over a wide range. As a result, the current gain $G_{cont}$ may be varied over a wide range in a highly accurate manner.

Figure 4:
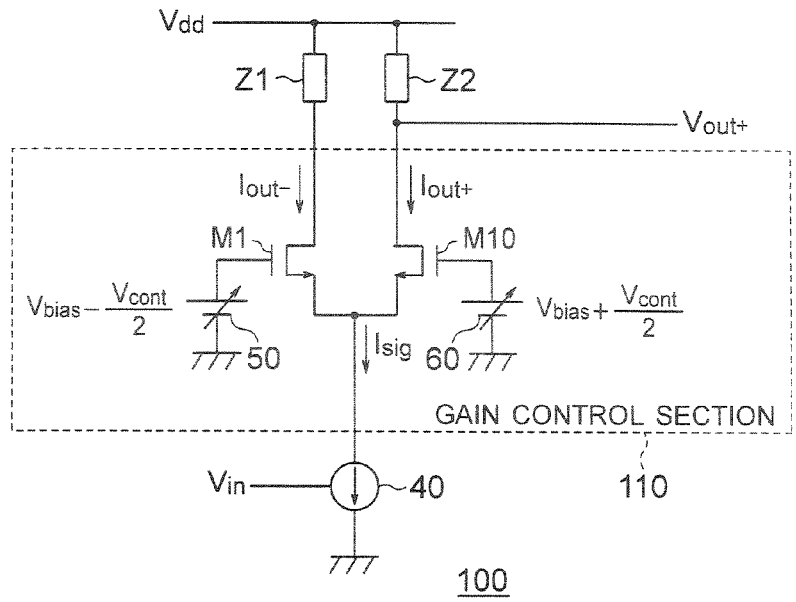
FIG. 4 is a circuit diagram showing a configuration of a variable gain amplifier according to an comparative example.

FIG. 4 shows a configuration of a variable gain amplifier 100 that uses only the analog gain control method as a comparative example. Like elements to those shown in FIG. 1 are denoted by like reference characters, and descriptions thereof will be omitted. A gain control section 110 of the variable gain amplifier 100 according to this comparative example is configured so that a transistor M10 is connected to the gain control section 110 in place of the digital gain control section 30 of the above-described embodiment.

Figure 5:
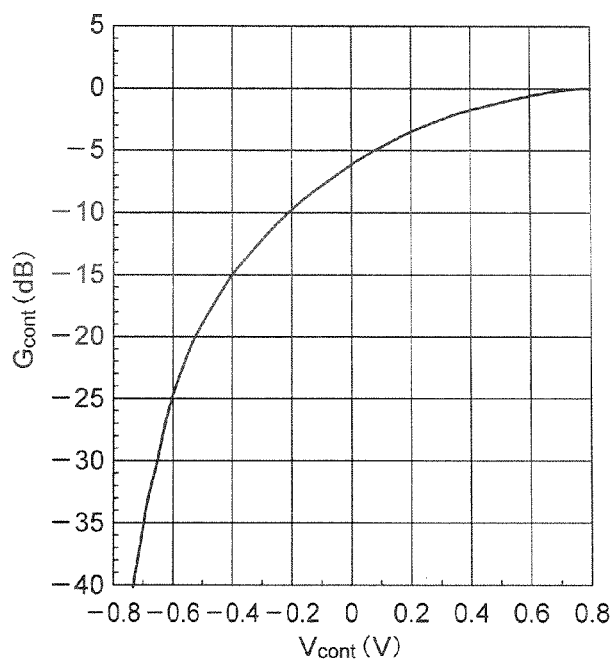
FIG. 5 is an explanatory diagram showing an example of a relationship between a control voltage $V_{cont}$, and the current gain $G_{cont}$ at the gain control section provided at the variable gain amplifier.
Figure 6:
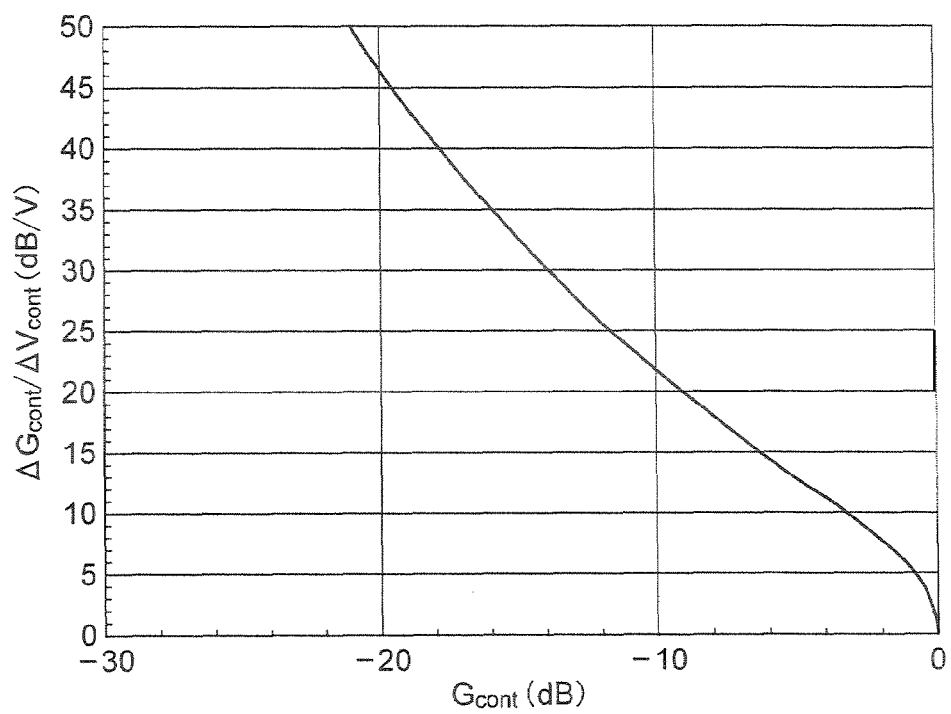
FIG. 6 is an explanatory diagram showing an example of a relationship between the current gain $G_{cont}$ at the gain control section provided at the variable gain amplifier, and a gain conversion sensitivity $G_{cont}/V_{cont}$.

FIG. 5 shows an example of a relationship between the control voltage $V_{cont}$ and the current gain $G_{cont}$ at the gain control section 110, while FIG. 6 shows an example of a relationship between the current gain $G_{cont}$ at the gain control section 110 and the gain conversion sensitivity $G_{cont}/V_{cont}$.

As shown in FIG. 6, the gain conversion sensitivity $G_{cont}/V_{cont}$ varies significantly according to the value of the current gain $G_{cont}$. Since the gain conversion sensitivity $G_{cont}/V_{cont}$ becomes significantly high when the current gain $G_{cont}$ is low, the gain control section 110 according to this comparative example is incapable of controlling the current gain $G_{cont}$ in an accurate manner. Conversely, according to the present embodiment, the current gain $G_{cont}$ may be controlled in a highly accurate manner over a wide range.

It is to be understood that the embodiment described above is merely an example, and does not limit the scope of the present invention. For instance, polarities of circuit elements included in the variable gain amplifier 10 (FIG. 1) may be reversed by forming the transistors M1, $M2_1$ to $M2_n$ and $M3_1$ to $M3_n$ using PMOS transistors instead of NMOS transistors. In addition, a circuit having a similar configuration to the variable gain amplifier 10 (FIG. 1) may be separately provided to differentiate the input voltage $V_{in}$ in order to input two input voltages $V_{in}$. Furthermore, one of the variable voltage sources 50 and 60 may be replaced with a constant voltage source.

What is claimed is:

1. An amplifier circuit comprising:
   a transistor group including a first transistor, a plurality of second transistors and a plurality of third transistors, wherein sources of the first transistor, the plurality of second transistors and the plurality of third transistors are commonly connected, drains of the first transistor and the plurality of second transistors are commonly connected, and drains of the plurality of third transistors are commonly connected;
   a first voltage generating section connected to the gate of the first transistor, which generates a desired first voltage and supplies the first voltage to the gate of the first transistor;
   a plurality of first switching elements respectively connected via respective output terminals thereof to the gates of the plurality of second transistors;
   a plurality of second switching elements respectively connected via respective output terminals thereof to the gates of the plurality of third transistors;
   a second voltage generating section connected to respective first input terminals of the plurality of first switching elements and the plurality of second switching elements, which generates a second voltage that is either the same as or different from the first voltage;
   a third voltage generating section connected to respective second input terminals of the plurality of first switching elements and the plurality of second switching elements, which generates a third voltage having a voltage difference with respect to the source voltage of the commonly-connected first to third transistors that is smaller than that of the second voltage; and
   a control section that respectively selectively supplies either the second voltage or the third voltage to the gates of the plurality of second transistors and the gates of the plurality of third transistors by respectively switching the connection states of the plurality of first switching elements and the plurality of second switching elements to the sides of the first input terminals or to the sides of the second input terminals.

2. The amplifier circuit according to claim 1, wherein the control section respectively switches the connection states of the plurality of first switching elements and the plurality of second switching elements so that a sum of the gate widths of the plurality of second transistors and the plurality of third transistors connected to the plurality of first switching elements and the plurality of second switching elements that have been switched to the first input terminal sides, among the plurality of first switching elements and the plurality of second switching elements, is substantially equal to the gate width of the first transistor.

3. The amplifier circuit according to claim 1, wherein the first voltage generating section and the second voltage generating section vary the first voltage and/or the second voltage as necessary.

4. The amplifier circuit according to claim 1, further comprising:
   a converter section that is connected to the sources of the first transistor, the plurality of second transistors and the plurality of third transistors and converts an input voltage into a current; and
   a load connected to the drains of the plurality of third transistors.

5. The amplifier circuit according to claim 1, wherein the first to third transistors have gate lengths that are approximately the same.

6. The amplifier circuit according to claim 1, wherein the first to third transistors are comprised of MOS transistors.

7. The amplifier circuit according to claim 1, wherein the first voltage generating section and the second voltage generating section are respectively comprised of variable voltage sources.

8. The amplifier circuit according to claim 1, wherein
the third voltage generating section generates a voltage of 0V as a third voltage.

9. The amplifier circuit according to claim 4, wherein
the converter section is comprised of a transconductance amplifier.

10. The amplifier circuit according to claim 4, further comprising:
a second load connected to drains of the first transistor and the plurality of second transistors.

11. A gain control method for an amplifier circuit comprising:
a transistor group including a first transistor, a plurality of second transistors and a plurality of third transistors, wherein sources of the first transistor, the plurality of second transistors and the plurality of third transistors are commonly connected, drains of the first transistor and the plurality of second transistors are commonly connected, and drains of the plurality of third transistors are commonly connected;
a first voltage generating section connected to the gate of the first transistor, which generates a desired first voltage and supplies the first voltage to the gate of the first transistor;
a plurality of first switching elements respectively connected via respective output terminals thereof to the gates of the plurality of second transistors;
a plurality of second switching elements respectively connected via respective output terminals thereof to the gates of the plurality of third transistors;
a second voltage generating section connected to respective first input terminals of the plurality of first switching elements and the plurality of second switching elements, which generates a second voltage that is either the same as or different from the first voltage;
a third voltage generating section connected to respective second input terminals of the plurality of first switching elements and the plurality of second switching elements, which generates a third voltage having a voltage difference with respect to the source voltage of the commonly-connected first to third transistors that is smaller than that of the second voltage, wherein when controlling gain of the amplifier circuit, the gain control method comprising:
respectively switching the connection states of the plurality of first switching elements and the plurality of second switching elements to the sides of the first input terminals or to the sides of the second input terminals; and
respectively selectively supplying either the second voltage or the third voltage to the gates of the plurality of second transistors and the gates of the plurality of third transistors.

12. The gain control method for an amplifier circuit according to claim 11, wherein when switching the connection states of the plurality of first switching elements and the plurality of second switching elements, the method respectively switches the connection states of the plurality of first switching elements and the plurality of second switching elements so that a sum of the gate widths of the plurality of second transistors and the plurality of third transistors connected to the plurality of first switching elements and the plurality of second switching elements that have been switched to the first input terminal sides, among the plurality of first switching elements and the plurality of second switching elements, is substantially equal to the gate width of the first transistor.

13. The gain control method for an amplifier circuit according to claim 11, wherein
the first voltage generating section and the second voltage generating section vary the first voltage and/or the second voltage as necessary.

14. The gain control method for an amplifier circuit according to claim 11, wherein the amplifier circuit further comprises:
a converter section that is connected to the sources of the first transistor, the plurality of second transistors and the plurality of third transistors and converts an input voltage into a current; and
a load connected to the drains of the plurality of third transistors.

15. The gain control method for an amplifier circuit according to claim 11, wherein
the first to third transistors have gate lengths that are approximately the same.

16. The gain control method for an amplifier circuit according to claim 11, wherein
the first to third transistors are comprised of MOS transistors.

17. The gain control method for an amplifier circuit according to claim 11, wherein
the first voltage generating section and the second voltage generating section are respectively comprised of variable voltage sources.

18. The gain control method for an amplifier circuit according to claim 11, wherein
the third voltage generating section generates a voltage of 0V as a third voltage.

19. The gain control method for an amplifier circuit according to claim 14, wherein
the converter section is comprised of a transconductance amplifier.

20. The gain control method for an amplifier circuit according to claim 14, wherein the amplifier circuit further comprises:
a second load connected to drains of the first transistor and the plurality of second transistors.

* * * * *